United States Patent [19]

Takenouchi

[11] 4,151,604
[45] Apr. 24, 1979

[54] IMAGE STORAGE AND OPTICAL READ-OUT DEVICE HAVING STRIPED ELECTRODES

[75] Inventor: Mutsuo Takenouchi, Isehara, Japan

[73] Assignee: Fuji Xerox Co., Ltd., Tokyo, Japan

[21] Appl. No.: 806,130

[22] Filed: Jun. 13, 1977

[30] Foreign Application Priority Data

Jun. 11, 1976 [JP] Japan .................................. 51-67772

[51] Int. Cl.² ...................... G11C 11/22; G11C 13/04
[52] U.S. Cl. .............................. 365/109; 340/166 FE; 365/127
[58] Field of Search ...... 340/173.2, 166 FE, 173 LM; 350/150; 365/109, 117, 121, 215, 234, 112, 127

[56] References Cited

U.S. PATENT DOCUMENTS

| | | | |
|---|---|---|---|
| 3,589,896 | 6/1971 | Wilcox | 365/112 |
| 3,681,765 | 8/1972 | Chapman | 340/173.2 |
| 3,702,724 | 11/1972 | Land et al. | 365/109 |
| 3,747,075 | 7/1973 | Keneman et al. | 365/112 |
| 3,906,462 | 9/1975 | Feinleib et al. | 365/109 |
| 3,926,520 | 12/1975 | Kaufman | 340/173.2 |
| 3,967,253 | 6/1976 | Tsuruishi | 340/173.2 |
| 4,051,463 | 9/1977 | Snyder et al. | 365/112 |

*Primary Examiner*—Bernard Konick
*Assistant Examiner*—Donald McElheny
*Attorney, Agent, or Firm*—Sughrue, Rothwell, Mion, Zinn and Macpeak

[57] ABSTRACT

An image storage-reproduction recording element comprises a thin ceramic plate 2 in which adjacent ferroelectric and antiferroelectric phases can coexist, a first transparent electrode 6 overlying one surface of the plate, and, in order, a non-conductive mirror layer 3, a photoconductive layer 4, and a periodically striped second transparent electrode 5 overlying the other surface of the plate. The striping produces a correspondingly striped ferroelectric and antiferroelectric pattern in the plate during recording in those areas of the plate exposed to the image, which reduces the reflected light and improves the image contrast during readout.

2 Claims, 6 Drawing Figures

IMAGE STORAGE AND OPTICAL READ-OUT DEVICE HAVING STRIPED ELECTRODES

BACKGROUND OF THE INVENTION

This invention relates to an image storage-reproduction recording element of the ferroceramic type wherein write-in is implemented by a photoconductive layer.

A conventional recording element of this general type is shown in FIG. 5, wherein a non-conductive mirror layer 3, a photoconductive layer 4, and a transparent electrode 5' are sequentially formed as a laminate on one surface of a thin ceramic plate 2 in which adjacent ferroelectric and antiferroelectric phases can coexist, and wherein a transparent electrode 6 is formed on the other surface of the plate 2. As illustrated in FIG. 4(a), an input light image 10' is focused on the recording element 1' by a suitable, commercially available projector. If the photoconductive layer 4 is composed of polyvinyl carbazole, for example, upon the application of a 200-volt direct current with the polyvinyl carbazole side being negative, the image is recorded due to the differences in the field strengths applied across the ceramic adjacent the light part N and dark parts M of the image.

Image reproduction may be accomplished using a condensing type of optical readout system C, as schematically shown in FIG. 2, which is convenient since lens aberration can be minimized to correspondingly reduce the distortion of the projected image. The readout system includes a light source 7, lenses 8, 8', 8'', a projection screen 9.

The conventional recording element 1' has a uniform recording surface electrode 5', which results in poor contrast during readout due to the large amount of light reflected from the image area.

SUMMARY OF THE INVENTION

The present invention has been developed to overcome the above disadvantage, and its object is to increase the contrast of a projected image by configuring the transparent electrode formed on the surface of the photoconductive layer in a striped pattern, preferably having a uniform bar width and spacing.

DETAILED DESCRIPTION OF THE PREFERRED EMBODIMENT

Figure 1:
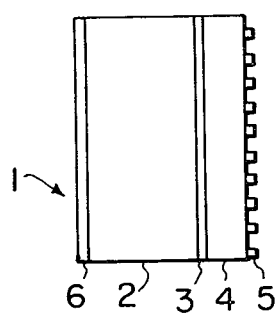
FIG. 1 shows a cross-sectional view of an embodiment of the present invention.

Referring now to the accompanying drawings, FIG. 1 shows an image storage-reproduction type recording element according to the invention including a thin ceramic plate 2 wherein a ferroelectric phase and an antiferroelectric or paraferroelectric phase can simultaneously coexist in adjacent areas. A non-conductive mirror layer 3 and a photoconductive layer 4 are formed in sequence on one surface of the plate 2, and a transparent electrode 5 having a periodic striped pattern is formed on the photoconductive layer. A transparent electrode 6 having a surface resistance of several ohms is formed on the other surface of the ceramic plate 2.

More specifically, PLZT 7/70/30 $(Pb(1-x)La_x(Zr(1-y)Ti_y)1-x/4O_3$, a type of ceramic expressed here as $100x/100y/100(1-y))$ is ground to a thickness of 0.3 millimeters, and one surface is first covered with a nonconductive mirror layer by evaporation of indium to a thickness of 200 angstroms and is then coated with a photoconductive film to a thickness of 2 microns using polyvinyl carbazole sensitized with tricyano-NN'-dimethylaniline. Subsequently, an indium oxide film shaped in a pattern of periodic stripes is formed thereon to a thickness of 100 microns through a slit screen (5 lp/mm) by evaporation. Indium oxide is evaporated on the other surface to a thickness of approximately 2,000 angstroms in such a manner as to have a surface resistance of approximately 10 ohms. The lead-out or terminal portions of the electrodes are produced by the evaporation of chromium-copper, to which leadwires may be connected by soldering.

Figure 2:
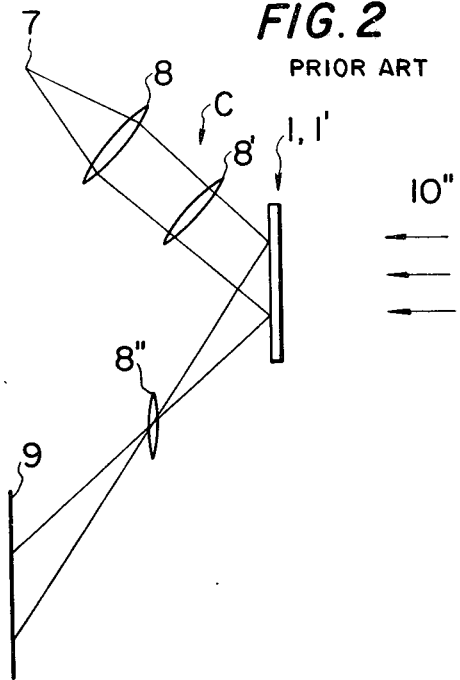
FIG. 2 shows a system for image storage and reading out said image.

Using the recording element thus obtained as a positive-to-negative reversal medium, a remarkably sharp image is produced during readout through reflection by a condensing type of optical readout system, such as that shown in FIG. 2.

As is known well, the minute pores that exist in a porcelain ceramic are extremely small in comparison with the refractive index of a crystal, and such pores cause optical mismatching which renders the ceramic nontransparent. Similarly, if a ceramic which is transparent in an antiferroelectric phase is converted to a ferroelectric phase, incident light is scattered to produce a nontransparent state. An image comprising transparent portions and nontransparent or light scattering portions can therefore be obtained by producing ferroelectric phases and antiferroelectric phases in desired areas corresponding to the image pattern.

Figure 3:
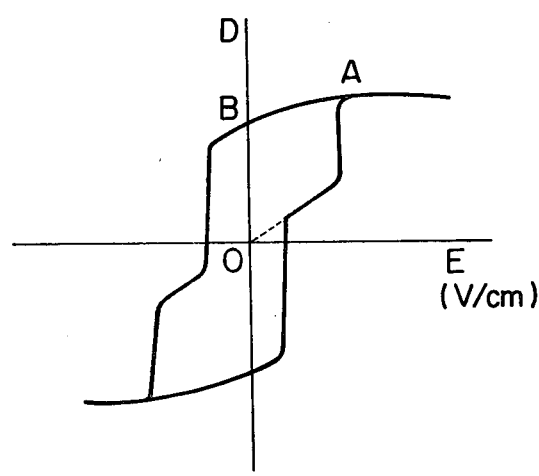
FIG. 3 shows a hysteresis curve for a ceramic element wherein ferroelectric and antiferroelectric phases may coexist.

FIG. 3 shows an exemplary D-E hysteresis curve of a ceramic where a ferroelectric phase and an antiferroelectric phase may coexist. The antiferroelectric phase exists at the origin point O, and may be transferred to point A by the application of a suitable electric field to establish a ferroelectric or light scattering phase. The latter remains at the retention point B upon the removal of the electric field. A return to the origin point O, or erasure, may be implemented by heating the ceramic to a critical temperature Tc at which the ferroelectric phase ceases to exist.

Such characteristics can be obtained by using a material produced by hot pressing, for example, under the conditions that x ranges from 0.05 to 0.1 and y from 0.6 to 0.8 in $Pb(1-x)La_x(Zr(1-y)Ti_y)1-x/4O_3$. For the erasure of a recorded image or data, radiant heat from an external source or Joule heat from the transparent electrode may be utilized. A re-recordable state is obtained by simply lowering the temperature of the element below Tc.

Figure 4A:
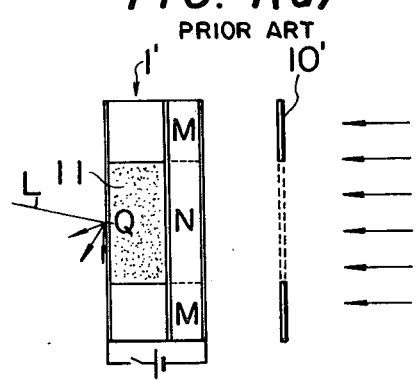
FIGS. 4(a) and 4(b) show recording modes in a conventional image storage-reproduction recording element and in such an element according to the present invention, respectively.
Figure 4B:
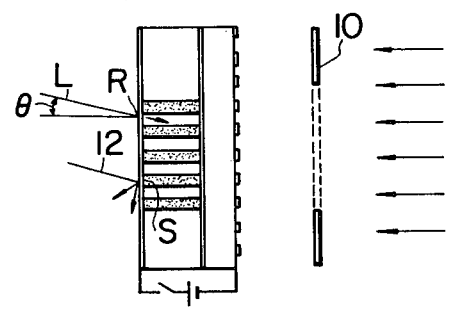
Figure 5:
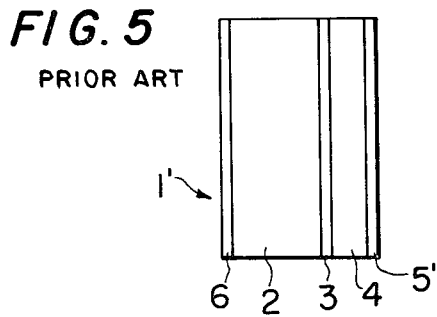
FIG. 5 shows a cross-sectional view of a conventional image storage-reproduction recording element.

FIG. 4(b) illustrates a recording mode in an element according to the present invention, and FIG. 4(a) illustrates such a mode in a conventional element, wherein the ferroelectric phases are shown by stippling. Readout light L is seen to scatter at points Q and S, but passes at point R intermediate two ferroelectric areas. The angle of inclination between the readout light L and the surface of the recording element is designated by $\theta$.

As may be seen from a comparison of FIGS. 4(a) and 4(b), when an image is recorded using the element of the present invention, which differs from the conventional element wherein a light-scattering ferroelectric phase is induced throughout the entire portion N, a ferroelectric phase is produced only periodically due to the striped, transparent electrode 5. This causes a great difference between the refractive indices of the ferroelectric and antiferroelectric phases, which in addition to the natural light scattering effects of the ferroelectric phases, results in a significant increase in the overall light scattering and enhanced image contrast.

Since the antiferroelectric portions are transparent, the image contrast could conceivably be reduced by using light having a small readout angle $\theta$. Depending upon the relative dimensional relationships between the striped pattern period and the ceramic thickness, however, if light having an angle of incidence greater than a critical angle $\theta_o$ is used, the light incident on the striped antiferroelectric phases, as at point R, will fail to reach the mirror surface and hence will not be reflected.

What is claimed is:

1. In an image storage-reproduction type recording element including a non-conductive mirror layer and a photoconductive layer successively overlying one surface of a thin ceramic plate in which adjacent ferroelectric and antiferroelectric phases can coexist, a first transparent electrode overlying said photoconductive layer, and a second transparent electrode overlying the other surface of said thin ceramic plate, said element of the type in which an area of said first transparent electrode illuminated by a light beam will be represented by a ferroelectric region in said ceramic, the improvement characterized by:

said first transparent electrode being formed in a striped pattern such that said light beam will span at least two stripe electrodes and said illuminated area will be represented by a plurality of adjacent ferroelectric and antiferroelectric regions in said ceramic plate.

2. An image recording element as defined in claim 1, wherein the first transparent electrode comprises a plurality of parallel stripes of equal width separated by a plurality of parallel spaces of equal width.

* * * * *